US005415972A

United States Patent [19]
Mayes

[11] Patent Number: 5,415,972
[45] Date of Patent: May 16, 1995

[54] CARBOXYL-CONTAINING PLASTICIZERS IN DRY-FILM PHOTOPOLYMERIZABLE COMPOSITIONS

[75] Inventor: Richard T. Mayes, Newark, Del.

[73] Assignee: Hercules Incorporated, Wilmington, Del.

[21] Appl. No.: 304,612

[22] Filed: Sep. 12, 1994

Related U.S. Application Data

[63] Continuation of Ser. No. 179,888, Jan. 10, 1994, abandoned, which is a continuation of Ser. No. 786,664, Nov. 1, 1991, abandoned.

[51] Int. Cl.$^6$ .......................... G03C 1/73; G03C 1/805
[52] U.S. Cl. .................................. 430/260; 430/284; 430/286; 430/288; 522/97
[58] Field of Search ............... 430/258, 284, 260, 263, 430/288, 286; 522/97

[56] References Cited

U.S. PATENT DOCUMENTS

| | | | |
|---|---|---|---|
| 3,960,572 | 6/1976 | Ibata et al. | 430/283 |
| 4,358,354 | 11/1982 | Iida et al. | 522/96 |
| 4,686,171 | 8/1987 | Fifield et al. | 430/273 |
| 4,725,524 | 2/1988 | Elzer et al. | 430/258 |
| 4,753,860 | 6/1988 | Hung et al. | 430/18 |
| 4,837,126 | 6/1989 | Lin | 430/284 |
| 4,849,321 | 7/1989 | Hung et al. | 430/284 |
| 4,855,212 | 8/1989 | Tate et al. | 430/281 |
| 5,102,774 | 4/1992 | Setthachayanon | 430/284 |

FOREIGN PATENT DOCUMENTS

| | | |
|---|---|---|
| 0125862 | 5/1984 | European Pat. Off. . |
| 0233623 | 2/1987 | European Pat. Off. . |
| 0452139 | 4/1991 | European Pat. Off. . |

OTHER PUBLICATIONS

Derwent Abstract No. 1658382, DE 2,622,022 (Dec. 1976).
Derwent Abstract No. 892807, US 3,681,298 (Jan. 1992).
Derwent Abstract No. 4821987, US 4,735,995 (Apr. 1988).
Derwent Abstract No. 4654523, EP 243605 (Nov. 1987).
Derwent Abstract No. 4275210, US 4,614,777 (Sep. 1986).

Primary Examiner—Charles L. Bowers, Jr.
Assistant Examiner—John A. McPherson
Attorney, Agent, or Firm—Robert P. O'Flynn O'Brien; Mark D. Kuller

[57] ABSTRACT

An aqueous-developable dry-film photopolymerizable composition is disclosed wherein the photopolymerizable composition contains a carboxyl-containing polyurethane having at least one ethylenically unsaturated end group as a plasticizer.

29 Claims, No Drawings

CARBOXYL-CONTAINING PLASTICIZERS IN DRY-FILM PHOTOPOLYMERIZABLE COMPOSITIONS

This application is a continuation of application Ser. No. 08/179,888, filed Jan. 10, 1994, now abandoned, which is a continuation of application Ser. No. 07/876,664, filed on Nov. 1, 1991, abandoned.

The present invention relates to aqueous-developable dry-film photopolymerizable compositions useful as photoresists. In particular it relates to such compositions containing a plasticizer.

Aqueous-developable dry-film photopolymerizable compositions can be used in the manufacture of printed circuit boards. Such photopolymerizable compositions are generally made by applying the solvated resist material to a carrier, such as a transparent polyester film, and then evaporating the solvent to produce the dry film. In typical use as a photoresist, a dry-film photopolymerizable composition is applied to a copper-clad substrate along with the carrier, exposed in certain areas through the carrier to actinic radiation that will cure the film, and then washed with an alkaline aqueous solution to remove the unexposed film from the copper. The exposed copper surface can then be removed in etching solutions leaving the protected area under the cured photopolymerizable composition to form the electrical circuit.

Photopolymerizable compositions intended as photoresists are preferably designed to keep exposure time and development time to a minimum as well as to ensure that the photopolymerizable composition is preferentially adhesive to the carrier material as opposed to the cover material. It is also important to maintain flexibility in the material after curing in order that the cured material does not crack or break during processing.

However, a delicate balance of ingredients must be maintained in photopolymerizable composition formulations. Materials that advantageously affect flexibility of the resist, even when used in small amounts, might easily adversely affect exposure time or development time or might adversely affect the preferentially adhesive character of the composition. Plasticizers such as N-ethyl-toluene sulfonamide have been incorporated into photopolymerizable composition formulations in order to increase flexibility. However, such plasticizers can leach out of the composition, which limits their effectiveness.

According to the present invention there is provided in an aqueous-developable dry-film photopolymerizable composition, the improvement wherein the photopolymerizable composition further comprises a carboxyl-containing polyurethane having at least one ethylenically unsaturated end group as a plasticizer. Ethylenic unsaturation in the polymer allows it to react with other materials in the photopolymerizable composition during photopolymerization, thereby becoming part of the cured matrix. Flexibility of the cured material is thereby improved since the plasticizer, as part of the cured matrix, will not leach out of the material. Carboxyl groups increase the polymer's solubility, which facilitates removal of the polymer from uncured areas during washing. The present invention also provides an article comprising the dry-film photopolymerizable composition disposed on a carrier. The present invention further provides in a method of using an aqueous-developable dry-film photopolymerizable composition comprising the steps of applying to a substrate the photopolymerizable composition disposed on a carrier, imagewise exposing (that is, exposing through a negative) the photopolymerizable composition through the carrier to actinic radiation sufficient to cure the photopolymerizable composition in exposed areas, removing the carrier from the photopolymerizable composition, and washing the photopolymerizable composition with an alkaline aqueous solution to remove uncured photopolymerizable composition from the substrate, the improvement wherein the photopolymerizable composition further comprises a carboxyl-containing polyurethane having at least one ethylenically unsaturated end group.

Aqueous-developable dry-film photopolymerizable compositions are well known in the art, and specific components thereof and their relative amounts in addition to the polyurethane plasticizer that are useful in accordance with the present invention will be readily apparent to the skilled artisan. "Dry" films are those in which solvent has been evaporated. In a preferred embodiment of the present invention, the photopolymerizable composition includes a carboxyl group-containing, film-forming polymeric binder, a free-radical photoinitiator, a polyfunctional addition-polymerizable monomer, and a thermal polymerization inhibitor in addition to the polyurethane plasticizer. Other optional additives are also useful, such as adhesive promoting agents. In the preferred embodiment, based on the total weight of the dry-film photopolymerizable composition, the amount of polymeric binder varies from 30-75%, more preferably from 45-60%, the amount of photoinitiator varies from 2-10% more preferably from 3-7% the amount of addition-polymerizable monomer varies from 5-40%, more preferably 15-25%, the amount of polyurethane plasticizer varies from 0.5-30%, more preferably from 2-30%, and most preferably from 9-15%, and the amount of thermal polymerization inhibitor varies from 0.003%-0.04%, more preferably from 0.01%-0.02%.

The polyurethane useful as a plasticizer in accordance with the present invention has a preferable acid number (that is, the number of milligrams of KOH need to neutralize one gram of the polymer) of 1-150, more preferably 2-140, most preferably about 10, and a preferable molecular weight of 5,000-50,000, more preferably 15,000-25,000. The polyurethane is preferably made by (1) reacting a mixture of at least two aliphatic diols and an aliphatic dihydroxy mono- or dicarboxylic acid with an excess of an aliphatic, cyclo-aliphatic or aromatic diisocyanate in the presence of a catalyst to produce an isocyanate-terminated urethane polymer having free carboxyl groups on the polymer backbone, and (2) reacting the terminal isocyanate groups of the product of step (1) with an aliphatic monohydroxy methacrylate.

The mixture of diols used in step (1) of the preferred process includes at least two aliphatic diols, preferably those having a weight average molecular weight of 1000 to 4000. Suitable aliphatic diols include polyethylene glycol; polypropylene glycol; a block copolymer made by reacting a propylene oxide polymer with ethylene oxide; polytetrahydrofuran diol; polypropylene adipate diol; neopentyl glycol adipate diol; 1,4-butanediol ethylene glycol adipate diol; 1,6-hexanediol phthalate adipate neopentyl glycol phthalate adipate diol and ethylene glycol adipate diol. The mixture of diols also includes an aliphatic dihydroxy mono- or dicarboxylic acid. Suitable dihydroxy carboxylic acids include bis-hydroxymethylpropionic acid, 2,3-dihydroxybutanoic acid; 2,4-dihydroxy-3, 3-dimethylbutanoic acid; 2,3-dihydroxyhexadecanoic acid; dihydroxy-butenoic acid, tartaric acid and 2,3-dihydroxy-2-methyl-propionic acid. Bis-hydroxymethylpropionic acid is preferred. The concentration of hydroxy-functional carboxylic acid can be varied from 0.2% to 30%, preferably from 2% to 5%, based on the total weight of the components used to prepare the urethane polymer.

The mixture of diols is reacted with an excess of an aliphatic, cycloaliphatic or aromatic diisocyanate. Suitable diisocyanates include, for example, 2,4- or 2,6-toluene diisocyanate; isophorone diisocyanate; 1,6-hexamethylene diisocyanate; 2,2,4-trimethylhexamethylene-1,6-diisocyanate; p,p'-methylene-bis-phenylisocyanate or mixtures thereof.

The equivalent hydroxyl to isocyanate ratio for the reaction can vary from 1.1 to 2.0. A ratio of 1.4 is preferred. The reaction temperature is preferably from 40° C. to 90° C., most preferably from 70° C. to 80° C. The reaction is preferably carried out in the presence of 50 to 300 ppm of an organic tin compound or from 0.1 to 3% of an aliphatic amine compound as a catalyst. Suitable catalysts include, for example, dioctyltin bis(isooctylmercaptoacetate), dibutyltin dilaurate, dibutyltin diisooctylmaleate, triethylenediamine, triethanolamine and triethylamine.

Dioctyltin bis(isooctylmercaptoacetate) is preferred. The urethane polymer that is formed is characterized by the presence of free carboxylic acid groups on the backbone of the polymer and isocyanate groups at the ends of the polymer chain.

In the second step of the reaction, the product from step (1) is reacted with an aliphatic monohydroxy acrylate or methacrylate in an amount sufficient to react with the isocyanate groups at the ends of the polymer chain. From 0.2 to 10 equivalents of excess hydroxy-functional methacrylate are preferred. Suitable acrylates and methacrylates include, for example, 2-hydroxypropyl acrylate and methacrylate, butanediol monoacrylate and monomethacrylate, butanediol monoacrylate and monomethacrylate, polyethylene glycol (10-20 moles ethylene oxide) monoacrylate and monomethacrylate and polypropylene glycol (5-20 moles propylene oxide) acrylate and methacrylate. An organic tin compound or an aliphatic amine compound of the types and amounts specified above can be used as a catalyst for this reaction is desired. The resulting urethane polymer is a liquid, has acrylate or methacrylate groups on the ends of the polymer chain, free carboxyl groups on the polymer backbone, and an acid number of 1 to 150.

The free-radical photoinitiator useful in accordance with this invention is a conventional photoinitiator activatable by actinic radiation that is thermally inactive below about 185° C. Examples of useful photoinitiators are found in U.S. Pat. No. 4,268,610, incorporated herein by reference. Exemplary photoinitiators are aromatic ketones, such as benzophenone and dimethoxyphenyl acetophenone. Other useful photoinitiators will be apparent to those skilled in the art.

The polyfunctional addition-polymerizable monomer that finds application in the subject invention is nongaseous, contains at least 2, preferably 2 to 4, more preferably 2 to 3 ethylenic double bonds. Having at least 2 ethylenic double bonds makes the monomer polyfunctional, i.e., capable of cross-linked polymerization. Suitable monomers include alkylene or polyalkylene glycol diacrylates. Monomers containing vinylidene groups conjugated with ester linkages are particularly suitable. Illustrative examples include but are not limited to ethylene diacrylate; diethylene glycol diacrylate; glycerol diacrylate; glycerol triacrylate; 1,3-propanediol dimethacrylate; 1,2,4-butanetriol trimethacrylate; 1,4-benzenediol dimethacrylate; 1,4-cyclohexanediol diacrylate; pentaerythritol tri- and tetramethacrylate; pentaerythritol tri-and tetraacrylate; tetraethylene glycol dimethacrylate; trimethylolpropane trimethacrylate; triethylene glycol diacrylate; tetraethylene glycol diacrylate; pentaerythritol triacrylate; trimethylol propane triacrylate; pentaerythritol tetraacrylate; 1,3-propanediol diacrylate; 1,5-pentanediol dimethacrylate; and the bis-acrylates and bis-methacrylates of polyethylene glycols, polypropylene glycols, and copolymers thereof of molecular weight from about 100 to about 500 (number average). Other useful polymerizable monomers will be apparent to those skilled in the art.

The thermal polymerization inhibitor useful in accordance with the instant invention prevents thermal polymerization during drying and storage. Examples of useful thermal polymerization inhibitors are p-methoxyphenol, hydroquinone, alkyl and aryl-substituted hydroquinones and quinones, tertbutyl catechol, pyrogallol, copper resinate, β-naphthol, 2,6-di-tert-butyl-p-cresol, 2,2'-methylene-bis(4-ethyl-6-t-butylphenol), p-tolylquinone, chloranil, aryl phosphites, and aryl alkyl phosphites. Other useful thermal polymerization inhibitors will be apparent to those skilled in the art.

The carboxyl group containing film-forming polymeric binder useful in accordance with this invention is prepared from one or more film-forming, vinyl type monomers and one or more alpha, beta ethylenically unsaturated carboxyl group containing monomers having 3-15 carbon atoms, which makes the binder soluble in aqueous media. Examples of useful vinyl type monomers are alkyl and hydroxyalkyl acrylates and methacrylates having 3-15 carbon atoms, styrene, and alkyl substituted styrenes. The acrylates and methacrylates are preferred. Examples of useful carboxyl group-containing monomers are cinnamic acid, crotonic acid, sorbic acid, acrylic acid, methacrylic acid, itaconic acid, propionic acid, maleic acid, fumaric acid, and half esters and anhydrides of these acids. Acrylic acid and methacrylic acid are preferred. Examples of useful binders are found in U.S. Pat. Nos. 4,539,286 and 4,985,343, the disclosures of which are incorporated herein by reference. Other useful binders will be apparent to those skilled in the art.

In a preferred embodiment, a monofunctional carboxyl group-containing addition polymerizable monomer is added to the photopolymerizable composition of the instant invention. The monofunctional (i.e., containing one ethylenic double bond) carboxyl group containing monomer is preferably used because the photopolymerized material made from the photopolymerizable composition is then strippable from a substrate in small pieces, while without this monomer, the photopolymerized material strips well, but in large sheets. Stripping in small pieces is preferred since the photopolymerized material between fine lines is more easily removed. Also, some stripping apparatuses have filtration systems that could have clogging problems if stripping occurs in large sheets. Based on the weight of the photopolymerizable composition of the instant invention, the amount of the monofunctional carboxyl group-containing addition-polymerizable monomer used is preferably from about 1% to about 10%, more preferably from about 1.5% to about 6%. Useful monofunctional carboxyl group-containing addition-polymerizable monomers are, for example, itaconic acid, beta-carboxyethylacrylate, citraconic acid, crotonic acid, monomethacryloyloxyethyl phthalate, monoacryloyloxyethyl phthalate, and fumaric acid. Itaconic acid and beta-carboxyethylacrylate are preferred. Other useful monomers will be apparent to those skilled in the art.

The photopolymerizable composition of this invention optionally includes additives well known in the art of photopolymerizable compositions, such as leuco (i.e., printout) dyes, background dyes, adhesion promoters, and antioxidants as disclosed in U.S. Pat. No. 4,297,435, incorporated herein by reference, and the heretofore mentioned U.S. Pat. No. 4,268,610. Other optional additives will be apparent to those skilled in the art. While desirable, the optional additives are not essential to the instant invention.

The photopolymerizable composition of this invention is prepared by mixing the various components in a solvent. Suitable solvents are alcohols, ketones, halogenated hydrocarbons, and ethers. Other solvents will be apparent to those skilled in the art. After mixing, the composition is then coated onto a support or carrier, and the solvent is evaporated. The photopolymerizable composition has a preferable thickness of 25.4 to 50.8 $\mu$m. Carriers are preferably about 0.0254–0.0508 mm thick. U.S. Pat. Nos. 3,469,982 and 4,293,635, incorporated herein by reference, disclose useful methods for preparing the photopolymerizable composition of this invention, i.e., as rolls of dry film sandwiched between a flexible support member and a flexible cover member. It will be apparent to those skilled in the art that dry films of the instant invention can be made on inflexible supports as well as flexible supports and may be supplied as stacks of laminated sheets as disclosed in the heretofore mentioned U.S. Pat. No. 4,268,610, as well as rolls.

In a preferred embodiment, the photopolymerizable composition of this invention is used as a photopolymerizable composition in the manufacture of printed circuit boards. Generally, the composition is coated onto the copper surface of a copper clad substrate, exposed to actinic radiation through a negative to create a latent image of photopolymerized material, and developed in a known aqueous developing solution to remove the unpolymerized composition from the copper surface. The portions of the surface not covered by the photopolymerized material are then modifiable by known processes, e.g., by plating or etching procedures, while the photopolymerizable composition protects the covered surface. The photopolymerized material can be ultimately removed from the substrate by washing with known stripping solutions.

The photopolymerizable composition of the instant invention is applied to the copper clad substrate by known procedures, such as hot shoe or hot roll lamination of the dry film attached to a transparent, peelable support, which support is removed after polymerization, as disclosed in the heretofore mentioned U.S. Pat. No. 4,293,635. Generally, the amount of actinic radiation used to polymerize the composition varies from about 35 to about 150 mJ/cm$^2$, with precise amounts determinable by those skilled in the art based on the specific composition used.

The copper clad substrate is any known copper/dielectric laminate used in circuit board manufacture, such as a copper clad board of fiberglass reinforced epoxy resin. Other useful dielectrics will be apparent to those skilled in the art.

The aqueous developing solutions used in accordance with this invention have, by weight, about 0.5–10% alkaline agents, preferably about 0.5–1%, and the latent imaged board is washed in the solution for a time sufficient to remove the unpolymerized composition. Useful alkaline agents are alkali metal hydroxides, e.g., lithium, sodium and potassium hydroxide, the base reacting alkali metal salts of weak acids, e.g., sodium carbonate and bicarbonate, and alkali metal phosphates and pyrophosphates. Sodium carbonate is preferred. The circuit board can be submerged in the developing solution or, preferably, the solution is high pressure sprayed on the board.

In general, the stripping solutions useful in removing the photopolymerized material in accordance with the instant invention are heated aqueous alkaline solutions, using the same alkaline agents as the developing solutions, but having a higher alkaline concentration, i.e., generally, by weight, from about 1%–10% preferably from about 1%–3%. Generally, the stripping solution is heated to a temperature of about 45° C.–65° C., preferably about 50° C–55° C. Washing the substrate to remove the photopolymerized material is by methods well known to those skilled in the art, such as spraying the substrate with the heated stripping solution or, preferably, agitating the substrate in a heated bath of the stripping solution.

Examples of the photoimaging techniques and equipment, including radiation sources, exposure intensity and duration, developing and stripping solutions and techniques, and laminated board composition useful in the preferred embodiment are disclosed in the heretofore described U.S. Pat. Nos. 3,469,982, 4,293,635, and 4,268,610.

In order to more clearly describe the present invention, the following non-limiting examples are provided. All parts and percentages in the examples are by weight unless indicated otherwise.

EXAMPLE 1

A polyurethane useful in accordance with the present invention is made according to the following formulation.

TABLE 1

|  | Equiv. wt. | Wt. % | Equiv. |
|---|---|---|---|
| polypropylene glycol[1] | 995 | 29.28 | 0.0294 |
| block copolymer[2] | 996 | 42.63 | 0.0428 |
| bis-hydroxymethyl-propionic acid | 67 | 2.37 | 0.0353 |
| toluene diisocyanate | 87.1 | 14.07 | 0.1615 |
| 2-hydroxypropyl methacrylate | 144 | 3.88 | 0.0269 |

[1] Weight average molecular weight 2,000, available from Olin Chemical Co. under the name Poly G 55-53.
[2] Weight average molecular weight 2,000, made by reacting ethylene oxide with a propylene oxide polymer and available from Olin Chemical Co. under the name Poly G 20-56.

The polypropylene glycol, block copolymer and bis-hydroxymethyl-propionic acid are dried under a nitrogen purge for 12 hours at approximately 60° C. Dioctyltin bis(isooctylmercaptoacetate) catalyst (0.015%) is added, followed by the toluene diisocyanate. The reaction mixture, still under nitrogen, is heated to 75° to 80° C. Samples are taken for isocyanate analysis. At 1.8% isocyanate, the 2-hydroxypropyl methacrylate containing 0.10% butylated hydroxytoluene as a stabilizer and 0.015% of the same tin catalyst are added under an air atmosphere. The final product has an acid number of 10.2.

EXAMPLE 2

This example demonstrates a dry film photopolymerizable composition made in accordance with the present invention that is provided as a roll of material in which the resist is sandwiched between a polyester carrier film and a polyethylene cover film. A photopolymerizable composition is prepared using the following ingredients: 77 parts acrylate polymer (31% solids) 13% ethyl acrylate, 65% methyl methacrylate, 22% methacrylic acid, made as in Synthesis Example of U.S. Pat. No. 4,985,343, except that methyl ethyl ketone (MEK) is used instead of isopropyl alcohol, and the final material is adjusted to 31% solids; 0.23 parts adhesion agent (molecular weight 22,000, partially hydrolyzed hydroxyl-modified vinyl chloride/vinyl acetate copolymer, about 90% vinyl chloride, 4% vinyl acetate, 2.3% hydroxyl content, available under the name UCAR VAGD from Union Carbide.); 3% methoxylated Bisphenol A dimethacrylate (available under the name BPE 500 from Shin-Nakamura Chemical Co. Ltd.); 2.9 parts urethane polymer from Example 1; 7 parts trimethylolpropane triacrylate (Sartomer Chemical Co.) 1.5 parts dimethoxyphenyl acetophenone (Ciba-Geigy); 0.3 parts isopropyl thioxanthone (Aceto Chemical Co.); 1.5 parts ethyl dimethylaminobenzoate (Aceto Chemical Co.); 0.6 parts pentabromomonochlorocyclohexane (PCBH, available from Nissei Chemical Company, Japan); 0.6 parts ethoxylated ethylene diamine (available under the name QUADROL from BASF Corporation, Chemical Division, Parsippany, N.J.); 0.02 parts butylated hydroxytoluene; 0.4 parts itaconic acid; 0.08 parts diethanolamine-modified tolyl triazole (available under the name REOMET 42 from Ciba-Geigy Corporation, Hawthorne, N.Y.); 0.05 parts first dye solution (2.44% Brilliant Green, 6.27% Victoria Blue, and 91.29% methanol); 0.4 parts second dye solution (5% Brilliant Green and 95% methanol); and 0.2 parts Leuco Crystal Violet. The composition is mixed thoroughly, coated on a 92 gauge transparent polyester film to thickness of about 38.1 μm. The material is then dried in an oven to remove the solvent. The dried photopolymerizable composition is then laminated with a 25.4 μm thick polyethylene film and rolled into a roll around a cylindrical core.

EXAMPLE 3

This example demonstrates a further embodiment in accordance with the present invention in which a dry film photopolymerizable composition is provided as a roll of material in which the resist is sandwiched between a polyester carrier film and a polyethylene cover film. A photopolymerizable composition is prepared using the following ingredients: 78 parts acrylate polymer (31% solids) as in Example 2; 0.23 parts adhesion agent (molecular weight 27,000, partially hydrolyzed hydroxyl-modified vinyl chloride/vinyl acetate copolymer, about 90% vinyl chloride, 4% vinyl acetate, 2.3% hydroxyl content, available under the name UCAR VAGD from Union Carbide.); 3% glycerol propoxy triacrylate; 2.9 parts urethane polymer from Example 1; 7 parts trimethylolpropane triacrylate; 2.5 parts benzophenone; 0.13 parts Michler's ketone; 1.5 parts ethyl dimethylaminobenzoate; 0.6 parts pentabromomonochlorocyclohexane; 0.6 parts ethoxylated ethylene diamine; 0.02 parts butylated hydroxytoluene; 0.08 parts diethanolamine-modified tolyl triazole; 0.05 parts first dye solution (2.44% Brilliant Green, 6.27% Victoria Blue, and 91.29% methanol); 0.4 parts second dye solution (5% Brilliant Green and 95% methanol); and 0.2 parts Leuco Crystal Violet. The composition is mixed thoroughly and rolls of dry film made as in Example 2.

EXAMPLE 4

A urethane polymer is prepared. Under nitrogen at 60° C., a mixture of 37.01 parts polypropylene glycol (as in Example 1), 53.88 parts block copolymer (as in Example 1), and 2 parts tartaric acid are dried overnight. The mixture is then cooled to about 45°-55° C., and 0.015 weight % dioctyltin bis(isooctylmercaptoacetate) catalyst is added followed by 13.36 parts toluene diisocyanate in three equal increments. After 30 minutes the reaction mixture is heated to 70° C. while still under nitrogen. The OH/NCO equivalent ratio is 1:1:3. Samples are taken for isocyanate analysis. At 1.5-2.0% isocyanate, 7.65 parts 2-hydroxypropyl methacrylate and 0.015 weight % of the tin catalyst along with 0.10 weight % butylated hydroxytoluene as a stabilizer are added under an air atmosphere. The temperature is then raised to approximately 75° C. until NCO content is less than about 0.1-0.3%. The final product has an acid number of 18.

EXAMPLE 5

This example demonstrates an embodiment in accordance with the present invention using the urethane polymer from Example 4 as a plasticizer. A photopolymerizable composition is prepared using the following ingredients: 78 parts acrylate polymer (31% solids) as in Example 2; 0.23 parts adhesion agent (molecular weight 27,000, partially hydrolyzed hydroxyl-modified vinyl chloride/vinyl acetate copolymer, about 90% vinyl chloride, 4% vinyl acetate, 2.3% hydroxyl content, available under the name UCAR VAGD from Union Carbide.); 3% glycerol propoxy triacrylate; 2.9 parts urethane polymer from Example 4; 7 parts trimethylolpropane triacrylate; 2.5 parts benzophenone; 0.13 parts Michler's ketone; 1.5 parts ethyl dimethylaminobenzoate; 0.6 parts pentabromomonochlorocyclohexane; 0.6 parts ethoxylated ethylene diamine; 0.02 parts butylated hydroxytoluene; 0.08 parts diethanolamine-modified tolyl triazole; 0.05 parts first dye solution (2.44% Brilliant Green, 6.27% Victoria Blue, and 91.29% methanol); 0.4 parts second dye solution (5% Brilliant Green and 95% methanol); and 0.2 parts Leuco Crystal Violet. The composition is mixed thoroughly and rolls of dry film made as in Example 2.

Claimed is:

1. A composition comprising: a carboxyl-containing polyurethane having a molecular weight of 15,000 or greater, free carboxyl groups on its backbone and at least one ethylenically unsaturated end group in an amount of 0.5-30% based on the weight of the composition, wherein the composition is aqueous-developable and dry-film photopolymerizable.

2. An article comprising the dry-film photopolymerizable composition of claim 1 disposed on a carrier.

3. The article of claim 2 wherein the polyurethane has an acid number of 2-140.

4. The article of claim 2 wherein the article comprises the photopolymerizable composition sandwiched between a flexible carrier film and a flexible cover film.

5. The article of claim 2 wherein the polyurethane is present in an amount of 2–30%, based on the weight of the dry-film photopolymerizable composition.

6. The article of claim 2 wherein the photopolymerizable composition comprises a hydroxyl-modified vinyl chloride/vinyl acetate polymer, a carboxyl group-containing, film-forming polymeric binder, a free-radical photoinitiator, a polyfunctional addition-polymerizable monomer, and a thermal polymerization inhibitor.

7. The article of claim 2 wherein the polyurethane has a methacrylate end group at each end of the polymer chain.

8. A composition comprising; a carboxyl group-containing, film-forming polymeric binder, a free-radical photoinitiator, a polyfunctional addition-polymerizable monomer, a thermal polymerization inhibitor, a solvent and 0.5–30%, based on the weight of the composition without the solvent, of a carboxyl-containing polyurethane having a molecular weight of 15,000 or greater, free carboxyl groups on its backbone and at least one ethylenically unsaturated end group; wherein the composition is aqueous-developable and dry-film photopolymerizable.

9. The composition of claim 8 wherein the polyurethane has an acid number of 2–140.

10. The composition of claim 8 wherein the polyurethane has a methacrylate or acrylate end group at each end of the polymer chain.

11. The composition of claim 1 wherein the carboxyl-containing polyurethane is present in an amount of 2–30% based on the weight of the dry film photopolymerizable composition.

12. The composition of claim 1 wherein the carboxyl-containing polyurethane is present in an amount of 9–15% based on the weight of the dry film photopolymerizable composition.

13. The article of claim 2 wherein the polyurethane is present in an amount of 0.5–30% based on the weight of the dry film photopolymerizable composition.

14. The article of claim 2 wherein the polyurethane is present in an amount of 9–15% based on the weight of the dry film photopolymerizable composition.

15. The composition of claim 8 wherein the polyurethane is present in an amount of 2–30%, based on the weight of the composition without the solvent.

16. The composition of claim 8 wherein the polyurethane is present in an amount of 9–15%, based on the weight of the composition without the solvent.

17. The composition of claim 8 wherein the film-forming polymeric binder is 30–75% of the composition based on the weight of the composition without the solvent.

18. The composition of claim 17 wherein the film-forming polymeric binder is 45–60% of the composition based on the weight of the composition without the solvent.

19. The composition of claim 8 wherein the photoinitiator is 2–10% of the composition based on the weight of the composition without the solvent.

20. The composition of claim 19 wherein the photoinitiator is 3–7% of the composition based on the weight of the composition without the solvent.

21. The composition of claim 8 wherein the polyfunctional addition-polymerizable monomer is 5–40% of the composition based on the weight of the composition without the solvent.

22. The composition of claim 21 wherein the polyfunctional addition-polymerizable monomer is 15–25% of the composition based on the weight of the composition without the solvent.

23. The composition of claim 8 wherein the thermal polymerization inhibitor is 0.003–0.04% of the composition based on the weight of the composition without the solvent.

24. The composition of claim 23 wherein the thermal polymerization inhibitor is 0.01–0.02% of the composition based on the weight of the composition without the solvent.

25. The composition of claim 8 wherein the film-forming polymeric binder is 30–75% of the composition, the photoinitiator is 2–10% of the composition, the polyfunctional addition-polymerizable monomer is 5–40% of the composition and the thermal polymerization inhibitor is 0.003–0.04% of the composition based on the weight of the composition without the solvent.

26. The composition of claim 1 wherein the carboxyl-containing polyurethane has a molecular weight of 15,000–50,000.

27. The composition of claim 1 wherein the carboxyl-containing polyurethane has a molecular weight of 15,000–25,000.

28. The composition of claim 8 wherein the carboxyl-containing polyurethane has a molecular weight of 15,000–50,000.

29. The composition of claim 8 wherein the carboxyl-containing polyurethane has a molecular weight of 15,000–25,000.

* * * * *